United States Patent [19]

McKim, Jr. et al.

[11] 4,185,249

[45] Jan. 22, 1980

[54] BIPOLAR SIGNAL TO CURRENT CONVERTER

[75] Inventors: James B. McKim, Jr., Oxford; Denis Rehse, Stanhope, both of N.J.

[73] Assignee: Hewlett-Packard Company, Palo Alto, Calif.

[21] Appl. No.: 936,302

[22] Filed: Aug. 23, 1978

[51] Int. Cl.² .............................................. H03F 1/34
[52] U.S. Cl. ........................................ 330/85; 330/98; 330/105; 330/293
[58] Field of Search .................... 330/85, 98, 102, 105, 330/291, 293

[56] References Cited

U.S. PATENT DOCUMENTS

| | | | |
|---|---|---|---|
| 2,886,659 | 5/1959 | Schroeder | 330/85 |
| 3,525,812 | 8/1970 | Verdier | 330/105 X |
| 3,970,953 | 7/1976 | Walker et al. | 330/105 X |
| 4,001,703 | 1/1977 | Saul et al. | 330/105 X |

FOREIGN PATENT DOCUMENTS

| | | | |
|---|---|---|---|
| 2622036 | 1/1977 | Fed. Rep. of Germany | 330/102 |
| 1149724 | 12/1957 | France | 330/85 |

OTHER PUBLICATIONS

Black, "Quad 405", *Funkschau*, vol. 48, no. 16, pp. 669-672, Jul. 1976.
Dandl et al., "Isolating dc-dc Coupler", *Rev. Sci. Instrum*, vol. 46, no. 6, Jun. 1975, pp. 784, 785.
Park, "Novel Active Hybrid Circuit and its Applications", *Electronics Letters*, vol. 11, no. 16, pp. 362-363, Aug. 7, 1975.

*Primary Examiner*—James B. Mullins
*Attorney, Agent, or Firm*—Donald N. Timbie

[57] ABSTRACT

Signal currents corresponding to a voltage to be converted into current or to a current to be amplified are applied to one input of an operational amplifier and its other input is referenced to ground. Its output is connected via a power amplifier and a small resistance to an output terminal and means are provided for supplying current proportional to the voltage across the resistance to the signal input of the operational amplifier with such polarity as to tend to cancel the signal current present thereat.

4 Claims, 1 Drawing Figure

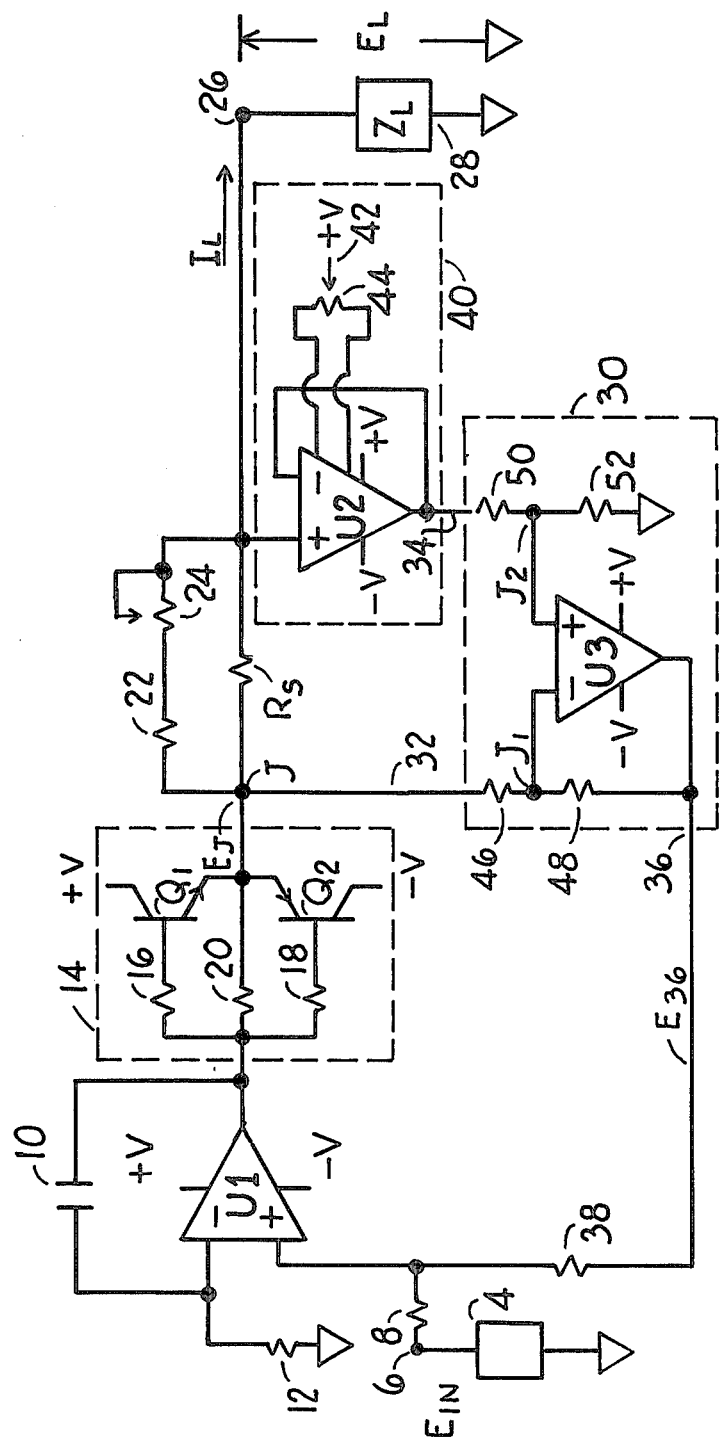

BIPOLAR SIGNAL TO CURRENT CONVERTER

BACKGROUND OF THE INVENTION

This invention relates to improvements in a circuit that is variously labeled a current pump, a controlled current source, or, when the input is a voltage, a bipolar voltage-to-current converter. As these names imply, the purpose of the circuit is to translate variations in an input signal of voltage or current into corresponding variations in current having a desired amplitude. This function can be performed by an open-ended circuit, but as is well known to those skilled in the art, variations in load, as well as in the characteristics of the active devices employed, can cause the variation in output current to differ substantially from the variation in the input signal. Considerable improvement has been attained by the utilization of feedback, generally positive but sometimes negative, to reduce the effects of variations in the characteristics of the ambient devices, but, depending on the particular circuit configuration employed, one or more of the following defects are present: general instability; instability when the load impedance is not significantly lower than impedances in the circuit; poor capacity for driving complex or active loads; potential for ground loop problems and difficulty in establishing a common reference because of the necessity for floating the load or the programming signal source; a small output voltage compliance in comparison with that normally available from the driving amplifier; the necessity for the programming signal source to supply load current; and a necessity for choosing between a high degree of current regulation at the risk of latch-up or a lower degree of current regulation with improved stability.

BRIEF DISCUSSION OF THE INVENTION

In accordance with this invention, all of these defects are avoided by utilizing a circuit that may briefly be described as follows. If the input electrical signal to be translated into a corresponding current is from a voltage source providing a voltage $E_{IN}$, the voltage is applied to an input terminal that is connected to a signal input of an amplifier via a first resistor. A series resistance $R_S$ is connected between the output of the amplifier and an output terminal at which the desired current $I_L$ is to appear. The voltage across the series resistance $R_S$ is coupled to means such as a differential amplifier that produces a voltage at its output that can be applied in a degenerative sense via a second resistor to the signal input of the amplifier and reduce the current flowing into that input to zero. Analyses to be presented will show that under this condition the output current $I_L$ that flows through the load is equal to $E_{IN}/R_S$ and therefore independent of amplifier gain and the load impedance. The exclusive use of negative feedback permits the attainment of stability without impairing regulation. If the input electrical signal to be translated is from a current source, the first resistor may be omitted.

Referring now to the drawing, the input signal voltage $E_{IN}$ that is to be translated into a corresponding current is supplied by a voltage source 4 to an input terminal 6 that is coupled by a resistor 8 to, in this case, the non-inverting input of an operational amplifier $U_1$. A capacitor 10 that provides frequency compensation is connected between the output of $U_1$ and its inverting input, and a resistor 12 is connected between the latter input and ground. Positive and negative operating potentials $+V$ and $-V$ are applied to $U_1$ by means not shown. In order to increase the current output capability beyond that of $U_1$, a suitable power amplifier, such as that included within the rectangle 14, may be connected between the output of $U_1$ and a series resistor $R_S$.

The particular power amplifier illustrated within the dashed rectangle 14 is comprised of complementary transistors $Q_1$ and $Q_2$ having their collector-emitter paths connected in series between a positive operating potential $+V$ and a negative operating potential $-V$, their bases respectively connected to the output of $U_1$ via resistors 16 and 18, respectively, and their emitters connected to $R_S$. Thus $Q_1$ and $Q_2$ are connected as emitter followers. In order to smooth out the crossover, when the output of $U_1$ is between $+0.6$ volts and $-0.6$ volts, a resistor 20 is connected between the output of $U_1$ and the emitters of $Q_1$ and $Q_2$. In order to compensate for a value of the resistance of $R_S$ that differs from that desired, and also to compensate for variations in other circuit elements, a fixed resistor 22 and variable resistor 24 are connected in series across the resistor $R_S$. Note that changing the effective value of $R_S$ changes the gain of this circuit as a whole. The end of $R_S$ remote from the power amplifier 14 is connected to an output terminal 26, and the load 28 having an impedance $Z_L$ is connected between the output terminal 26 and ground.

A differential amplifier within a dashed rectangle 30 has inputs 32 and 34 respectively coupled to opposite ends of the series resistor $R_S$ and its output 36 connected by a resistor 38 to the non-inverting input of $U_1$. The input 32 of the differential amplifier 30 is connected directly to the junction J between the power amplifier 14 and the series resistor $R_S$, and the other input 34 is connected via a buffer amplifier included within a dotted rectangle 40 to the output terminal 26. The buffer amplifier 40 isolates the differential amplifier 30 so that it does not draw any significant current through $R_S$.

The particular buffer amplifier shown within the rectangle 40 includes a differential amplifier $U_2$ connected as a voltage follower. Its non-inverting input is connected to the output terminal 26, and its output is connected directly to its inverting input as well as to the input 34 of the amplifier 30. Positive and negative operating potentials $-V$ and $+V$ are provided for $U_2$ by means not shown. If $U_2$ is an LM318H, offsets for the entire circuit may be nulled by application of a voltage $+V$ to a tap 42 on a resistor 44 that is connected between inputs 1 and 5 (not numbered) of $U_2$.

The particular differential amplifier 30 that is illustrated includes an operational amplifier $U_3$ having positive and negative operating potentials $-V$ and $+V$ applied thereto from means not shown. The inverting input of $U_3$ is connected to the junction $J_1$ of resistors 46 and 48 that are connected in series between the junction J and the output of $U_3$. The non-inverting input of $U_3$ is connected to the junction $J_2$ of resistors 50 and 52 that are connected in series between the input 34 of the differential amplifier 30 and ground. The output of $U_3$ is connected to the output 36 of the amplifier 30.

The inverting input of $U_1$ is essentially at ground potential and since any difference amplifier in a closed loop system is in equilibrium only when both inputs are at the same potential, it follows that the non-inverting input of $U_1$ must be essentially at ground potential also. Given that no current can flow into the input of an ideal amplifier, the ground potential at the non-inverting input must be maintained by the voltage $E_{36}$ at the output of the differential amplifier 30. This occurs if $E_{36}$ is opposite in polarity to $E_{IN}$ and proportional to it by the ratio of the resistances of the resistors 8 and 38 as shown in equation (1) below. In this and subsequent equations, the resistance of a resistor is indicated by the letter R with a numeric subscript corresponding to the number indicating the resistor in the drawing.

$$E_{IN}/R_8 = -E_{36}/R_{38} \qquad (1)$$

The difference amplifier $U_2$ is connected as a voltage follower so that its output voltage is equal to the load voltage $E_L$ applied to its non-inverting input terminal. Since the input impedance of a voltage follower is effectively multiplied by the open loop gain of the amplifier, which for practical purposes is infinite, $U_2$ isolates resistors 50 and 52 from the output side of $R_S$ so as not to significantly affect the output current $I_L$. Therefore, the voltage drop across $R_S$ which is $E_J - E_L$ is practically proportional to the load current $I_L$. This voltage is inverted in polarity by amplifier $U_3$ at a gain determined by the ratio of the resistances $R_{48}$ and $R_{46}$ of the resistors 48 and 46, assuming that $R_{46}/R_{48} = R_{50}/R_{52}$. That the voltage $E_{36}$ is proportional to the load current can be shown as follows:

$$E_{36} = (R_{48}/R_{46})(E_L - E_J) \qquad (2)$$

Since $E_J$ must always be greater in absolute value than $E_L$:

$$(E_L - E_J) = -I_L R_S \qquad (3)$$

and $$E_{36} = -I_L R_S R_{48}/R_{46} \qquad (4)$$

Substituting equation (4) for $E_{36}$ in equation (1):

$$E_{IN}/R_8 = I_L R_S R_{48}/R_{38} R_{46} \qquad (5)$$

and $$I_L = E_{IN} R_{38} R_{46}/R_S R_8 R_{48} \qquad (6)$$

By suitably choosing the values of the resistors, we obtain $$I_L = E_{IN}/R_S \qquad (7)$$

It is most important to note that the load current $I_L$ is entirely independent of the load impedance and further that no term in the transfer equation containing $Z_L$ has been cancelled out through resistor selection or trimming. It is for these reasons the circuit exhibits both total freedom from static latch-up at any value of $Z_L$ and ideal current regulation except for minimal errors introduced by finite gain and common mode limitations.

The capacitor 10 and the resistor 12 provide frequency compensation. The resistor 12 is selected to be approximately equal to the parallel impedance of the resistors 8 and 38 so as to minimize the effects of $U_1$ bias current drift with temperature while the value of the capacitor 10 is selected so as to interact with the resistor 12 in such manner that $U_1$ reaches gain crossover before either $U_2$ or $U_3$, thus assuring dynamic stability for the circuit as a whole.

Although components having other values and different amplifiers may be used, the following have been found to work in an entirely satisfactory manner:

| | |
|---|---|
| $U_1$ - LF356BH | $Q_1$ - 2N3498 |
| $U_2$ - LM318H | $Q_2$ - 2N3634 |
| $U_3$ - LM318H | $+V$ = 18 volts |
| | $-V$ = $-18$ volts |
| $R_8$ = 10K | $R_{38}$ = 10K |
| $R_{12}$ = 4.87K | $R_{44}$ = 25K |
| $R_{16}$ = .5K | $R_{46}$ = 2K |
| $R_{18}$ = .5K | $R_{48}$ = 10K |
| $R_{20}$ = 1K | $R_{50}$ = 2K |
| $R_{22}$ = 9.09K | $R_{52}$ = 10K |
| $R_{24}$ = 2.0K | $C_{10}$ = 51 pf |
| $R_S$ = 101 $\Omega$ | |
| $R_S(\text{eff}) = \dfrac{R_S(R_{22} + R_{24})}{R_S + (R_{22} + R_{24})} \approx 100\Omega$ | |

This particular circuit accepts input signals of $\pm 10$ volts. In the actual circuits using Equation (6) we obtain $$I_L = (E_{IN} \times 10^4 \times 2 \times 10^3)/(100 \times 10^4 \times 10^4) \qquad (8)$$

and $$I_L = E_{IN}/500 \text{ or } 2MA/VOLT \qquad (9)$$

Whereas the circuit described operates to translate voltage variations into current variations, it can also be used as a current amplifier. In this case, the voltage source 4 and the resistor 8 are such as to constitute a current source. The degree of amplification will depend on the values of the resistors 46, 48, 50, 52 and of the resistor 38. The value of the load current $I_L$ at which the circuit stabilizes will be the value at which the absolute value of $E_{36}/R_{38}$ equals the current from the signal current source.

If the connections of the inputs 32 and 34 of the differential amplifier are transposed and the inputs to $U_1$ are transposed, the phase of the load current, $I_L$, will be reversed with respect to the input signal. Although $U_1$ has been illustrated as being an operational amplifier, it will readily be understood by those skilled in the art that it could be a single ended non-inverting amplifier having suitable biasing circuits. If it is desired to reverse the phase of the output current of the circuit, an inverting amplifier must be used and the connections of the differential amplifier $U_3$ to the series resistor $R_S$ must be reversed.

What is claimed is:

1. A circuit for producing an output current through a load that corresponds to an input signal, comprising
an operational amplifier having an inverting input, a non-inverting input, and an output,
means referencing one of said inputs to ground,
an input terminal,
direct current conducting means connected between said input terminal and the other of said inputs of said operational amplifier,
a power amplifier having an input direct-current coupled to the output of said operational amplifier and having an output,
a first output terminal,
a current sensing resistor direct-current coupled between the output of said power amplifier and said first output terminal,
a closed loop differential amplifier having an inverting input, a non-inverting input, and an output, means coupling one of said inputs of said closed loop differential amplifier to the output of said power amplifier, a buffer amplifier, means coupling said buffer amplifier between said first output terminal and the other of said inputs of said closed loop differential amplifier, a coupling resistor direct-current connected between the output of said closed loop differential amplifier and the input of said operational amplifier to which said direct-current coupling means is connected, said latter input thereby acting as a summing point for current derived from a signal source, when present, and current from the output of said differential amplifier so as to produce the effect of an impedance approaching infinity in series with a load, when present, the points of connection of the inputs of said operational amplifier and said differential amplifier being such that the latter provides negative feedback to the former, and a second output terminal referenced to ground.

2. A circuit as set forth in claim 1 wherein said closed loop differential amplifier is comprised of an operational amplifier having an inverting input, a non-inverting input, and an output, said output being the output of said differential amplifier, first and second resistors connected in series in the order named between said output of said power amplifier and said output of said operational amplifier, the junction of said resistors being connected to one of said inputs of said operational amplifier, and wherein said means coupling said buffer amplifier to the other of said inputs of said closed loop differential amplifier is comprised of third and fourth resistors connected in series in the order named between the output of said buffer amplifier and ground, the junction of said third and fourth resistors being connected to the other of said inputs of said operational amplifier.

3. A circuit as set forth in claim 2 wherein said direct current conducting means is a fifth resistor.

4. A circuit as set forth in claim 3 wherein the ratio of the value of said first resistor to the value of said second resistor is the inverse of the ratio between the value of said coupling resistor and the value of said fifth resistor, thereby making the current flowing to a load, when connected to said first and second output terminals, equal to a signal voltage applied to said fifth resistor divided by the resistance of said sensing resistor.

* * * * *